(12) United States Patent  
Yang et al.

(10) Patent No.: US 9,025,374 B2
(45) Date of Patent: May 5, 2015

(54) SYSTEM AND METHOD TO UPDATE READ VOLTAGES IN A NON-VOLATILE MEMORY IN RESPONSE TO TRACKING DATA

(71) Applicant: Sandisk Technologies Inc., Plano, TX (US)

(72) Inventors: Nian Niles Yang, Mountain View, CA (US); Ryan Takafuji, San Jose, CA (US); Seungjune Jeon, Milpitas, CA (US); Chris Avila, Saratoga, CA (US); Steven Sprouse, San Jose, CA (US)

(73) Assignee: Sandisk Technologies Inc., Plano, TX (US)

( * ) Notice: Subject to any disclaimer, the term of this patent is extended or adjusted under 35 U.S.C. 154(b) by 173 days.

(21) Appl. No.: 13/757,771

(22) Filed: Feb. 2, 2013

(65) Prior Publication Data

US 2014/0173172 A1    Jun. 19, 2014

Related U.S. Application Data

(60) Provisional application No. 61/736,967, filed on Dec. 13, 2012.

(51) Int. Cl.
*G11C 16/04* (2006.01)
*G06F 12/02* (2006.01)
*G11C 29/02* (2006.01)
*G11C 16/00* (2006.01)

(52) U.S. Cl.
CPC ............ *G06F 12/0246* (2013.01); *G11C 16/00* (2013.01); *G11C 29/021* (2013.01); *G11C 29/028* (2013.01)

(58) Field of Classification Search
USPC .......................... 365/185.02, 185.12, 185.09
See application file for complete search history.

(56) References Cited

U.S. PATENT DOCUMENTS

| 5,172,338 A | 12/1992 | Mehrotra et al. |
| 6,094,368 A | 7/2000 | Ching |

(Continued)

FOREIGN PATENT DOCUMENTS

| WO | 9908284 A2 | 2/1999 |
| WO | 2007134188 A2 | 11/2007 |

OTHER PUBLICATIONS

Invitation to Pay Additional Fees and Partial International Search Report of the International Searching Authority (EPO) for International Application No. PCT/US2013/071272, mailed Mar. 19, 2014, 7 pages.

(Continued)

*Primary Examiner* — Huan Hoang
(74) *Attorney, Agent, or Firm* — Toler Law Group, PC (57) ABSTRACT

A method includes reading a representation of tracking data from at least a portion of a non-volatile memory. The method further includes adjusting a read voltage based on a comparison between a number of bits in tracking data as compared to a count of bits in the representation of the tracking data.

25 Claims, 6 Drawing Sheets

(56) References Cited

U.S. PATENT DOCUMENTS

| | | |
|---|---|---|
| 6,317,363 B1 | 11/2001 | Guterman et al. |
| 6,538,922 B1 | 3/2003 | Khalid et al. |
| 8,171,380 B2 | 5/2012 | Yang et al. |
| 2004/0047182 A1* | 3/2004 | Cernea et al. ............ 365/185.03 |
| 2007/0262890 A1 | 11/2007 | Cornwell et al. |
| 2008/0181045 A1* | 7/2008 | Nam ........................ 365/230.08 |
| 2008/0273384 A1 | 11/2008 | Sarin et al. |
| 2009/0271563 A1 | 10/2009 | Gopalan et al. |
| 2010/0020611 A1 | 1/2010 | Park |
| 2011/0087852 A1 | 4/2011 | Pape |
| 2012/0188820 A1 | 7/2012 | Neumeyer et al. |

OTHER PUBLICATIONS

International Search Report and Written Opinion of the International Searching Authority (EPO) for International Application No. PCT/US2013/071272, mailed May 27, 2014, 18 pages.

* cited by examiner

SYSTEM AND METHOD TO UPDATE READ VOLTAGES IN A NON-VOLATILE MEMORY IN RESPONSE TO TRACKING DATA

CROSS-REFERENCE TO RELATED APPLICATIONS

The present application claims priority to U.S. Provisional Application No. 61/736,967, filed Dec. 13, 2012, which application is hereby incorporated by reference in its entirety.

FIELD OF THE DISCLOSURE

The present disclosure is generally related to updating read voltages in a data storage device.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices can provide increased storage density by storing 3 bits per cell, 4 bits per cell, or more.

Storing multiple bits of information in a single flash memory cell typically includes mapping sequences of bits to states of the flash memory cell. For example, a first sequence of bits "110" may correspond to a first state of a flash memory cell and a second sequence of bits "010" may correspond to a second state of the flash memory cell. After determining that a sequence of bits is to be stored into a particular flash memory cell, the particular flash memory cell may be programmed to a state (e.g., by setting a threshold voltage) that corresponds to the sequence of bits.

Once memory cells in a data storage device have been programmed, data may be read from the memory cells by sensing the programmed state of each memory cell by comparing the cell threshold voltage to one or more read voltages. However, the sensed programming states can sometimes vary from the written programmed states due to one or more factors, such as data retention and program disturb conditions.

SUMMARY

Accuracy of reading data stored in a data storage device may be improved by updating a set of read voltages used to read the stored data in order to reduce a count of errors associated with reading the stored data. Updating may be performed based on a comparison of tracking data to a representation of the tracking data that is read from a memory of the data storage device. For example, updating may be performed in response to a comparison of a number of bits in the tracking data to a count of bits in a representation of the tracking data read from the memory. The tracking data may correspond to a portion of a tracking pattern that is stored in the memory and the number of bits in the tracking data may indicate a first number of storage elements in one or more states when the tracking pattern is stored to the memory. The count of bits in the representation of the tracking data may indicate a second number of storage elements in the one or more states when the representation of the tracking data is read from the memory. One or more updated read voltages may be determined based on the comparison.

DETAILED DESCRIPTION

Figure 1:
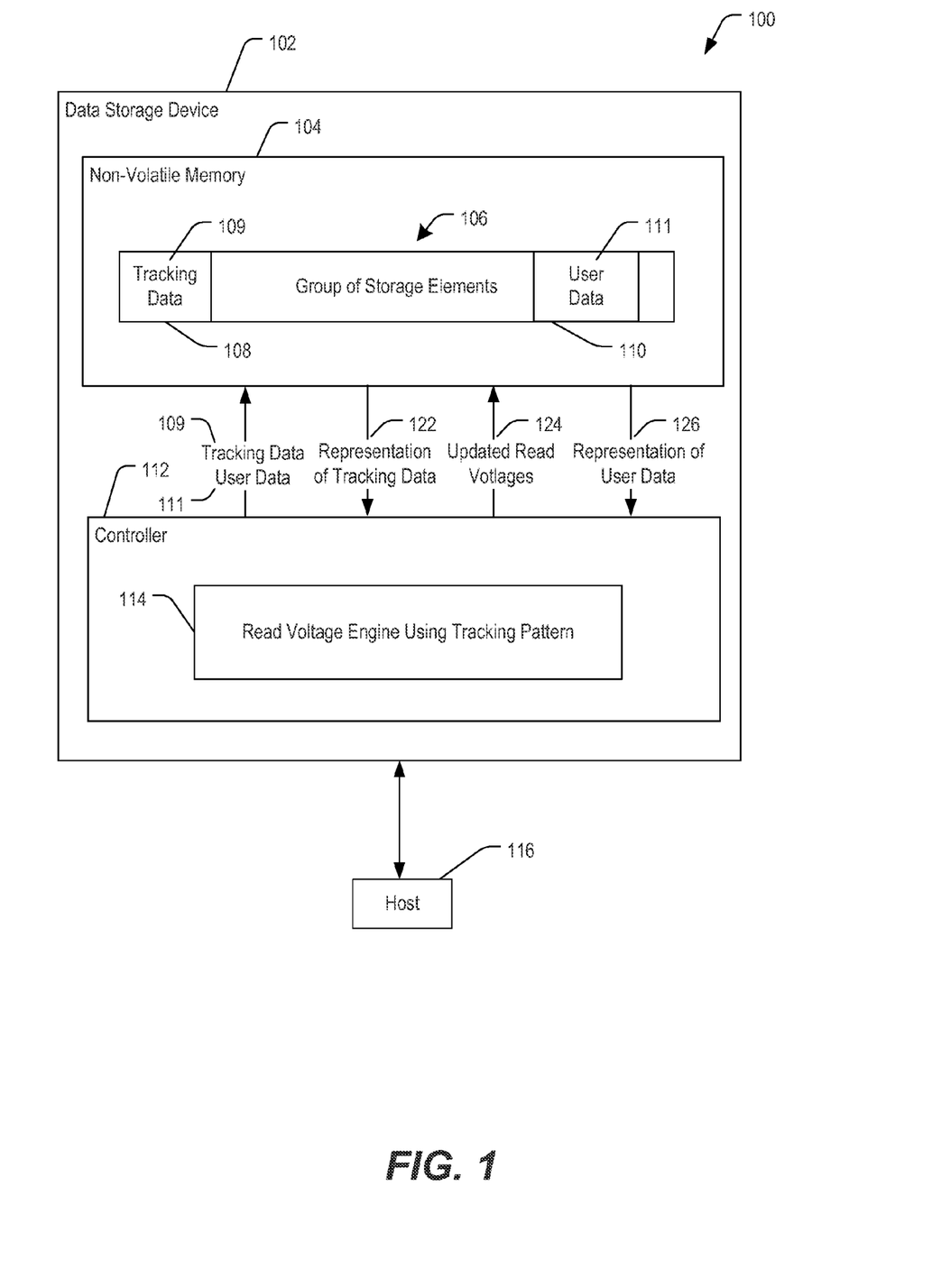
FIG. 1 is a block diagram of an illustrative embodiment of a system including a data storage device configured to compare a representation of tracking data read from a memory to tracking data.

Referring to FIG. 1, a particular illustrative embodiment of a system 100 includes a data storage device 102 that is configured to update read voltages. The data storage device 102 includes a memory 104 coupled to a controller 112. The data storage device 102 is configured to enable exchange of data between a host device 116 and the memory 104 of the data storage device 102.

The host device 116 may be configured to provide data to be stored at the memory 104 or to request data to be read from the memory 104. For example, the host device 116 may include a mobile telephone, a music or video player, a gaming console, an electronic book reader, a personal digital assistant (PDA), a computer such as a laptop computer, a notebook computer, or a tablet, any other electronic device, or any combination thereof.

The data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a Compact-Flash® (CF) card (trademark of SanDisk Corporation, Milpitas, Calif.). As another example, the data storage device 104 may be embedded memory in the host device 102, such as eMMC® (trademark of JEDEC Solid State Technology Association, Arlington, Va.) memory and eSD memory, as illustrative examples.

The memory 104 may be a non-volatile memory of a flash device, such as a NAND flash device, a NOR flash device, or any other type of flash device. The memory 104 may include a group of storage elements 106. For example, the group of storage elements 106 may include a word line, a page, or a block. The word line may include a first portion 108 configured to store tracking data 109 and a second portion 110 configured to store user data 111. The tracking data 109 may be retrievable for determination of errors in the tracking data 109. Each storage element in the group of storage elements 106 may be a memory cell of a multi-level cell (MLC) memory.

Figure 2:
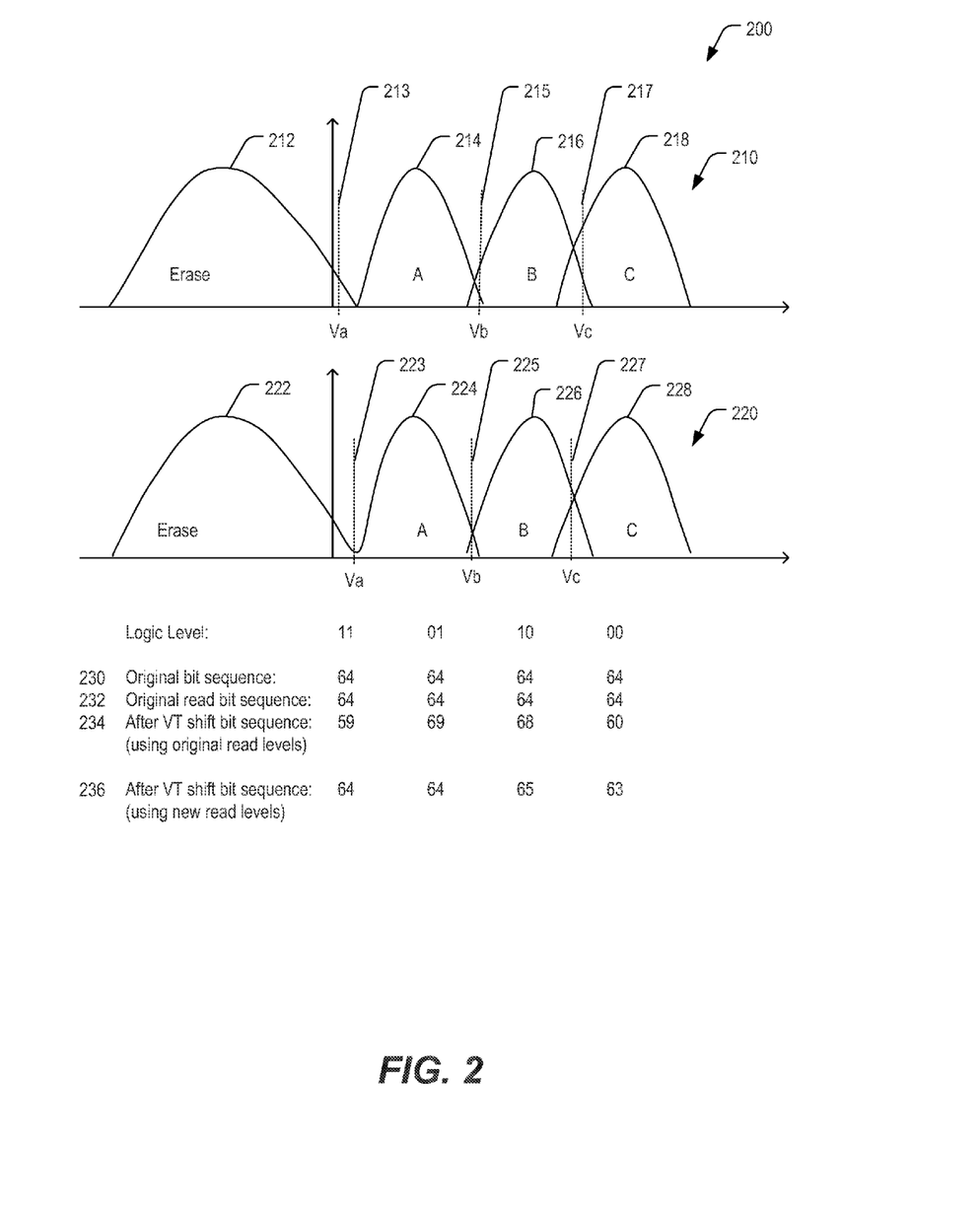
FIG. 2 is a diagram illustrating an example of updating a read voltage that may be performed by the data storage device 102 of FIG. 1.

Each storage element may have an associated threshold voltage corresponding to a state of the storage element. Each state may correspond to a particular range of threshold voltage values, such as illustrated in FIG. 2. For example, a cell voltage distribution (CVD) for a multi-level-cell (MLC) memory may be approximated by a set of Gaussian functions. Each Gaussian function may represent a threshold voltage distribution of cells programmed to a particular state.

The state of each storage element represents data stored at the storage element, such as according to a mapping of bits to states of the storage element. The data stored at the storage element may be read by comparing a threshold voltage of the storage element to one or more read voltages of a set of read voltages that are stored in the memory 104, such as described with respect to FIG. 2. One or more read voltages of the set of read voltages may be used to sense one or more data bits stored in each of the storage elements of the group of storage elements 106.

The controller 112 may include a read voltage engine 114. Alternatively, the read voltage engine 114 may be within the memory 104. Due to various effects such as data retention, read disturb, and/or program disturb, threshold voltages of the data storage elements may shift, producing errors when read using the original set of read voltages. The read voltage engine 114 may be configured to adjust a read voltage to be used by the controller 112 to read data from the non-volatile memory 104.

During operation, when data is to be read from the memory 104, such as when a request is received from the host device 116, the controller 112 may be configured to read a representation 122 of the tracking data 109 from at least a portion of the memory 104, such as the first portion 108. For example, over time, the stored tracking data 109 may be susceptible to errors, resulting in the representation 122 of the tracking data 109 that may include one or more errors. Similarly, the controller 112 may be configured to read a representation 126 of the user data 111 from another portion of the memory 104, such as the second portion 110.

The controller 112 may further be configured to compare a count of bits in the representation 122 of the tracking data 109 corresponding to storage elements in one or more states (such as an erase state, a state A, a state B, and a state C as illustrated in FIG. 2) read from the memory 104 to a corresponding count of bits in the tracking data 109. To illustrate, the tracking data 109 may correspond to a portion of a tracking pattern. For example, the tracking pattern may include a first sequence of bits that corresponds to a first state of a flash memory cell, a second sequence of bits that correspond to a second state of the flash memory cell, etc. The tracking pattern may be interleaved across multiple logical pages when stored in the first portion 108, and the tracking data 109 may correspond to a single bit (e.g., a most significant bit) of each of the sequences of bits that is read by reading a single logical page of data from the group of storage elements 106.

The controller 112 may be configured to determine a number of bits in the tracking data 109 (e.g., a count of '1' bits in the tracking data 109) corresponding to a first number of storage elements in the first state when the tracking pattern is stored to the memory 104. The controller 112 may be configured to determine a count of bits in the representation 122 of the tracking data 109 read from the memory 104 (e.g., a count of '1' bits in the representation 122) that corresponds to a second number of storage elements in the first state when the representation 122 of the tracking data 109 is read from the memory 104. The controller 112 may be configured to compare the number of bits in the tracking data 109 to the count of bits in the representation 122 of the tracking data, and the read voltage engine 114 may be configured to adjust a read voltage to be used by the controller 112 to read data from the memory 104 based on the comparison.

For example, as described in further detail with respect to FIG. 2, when the tracking pattern corresponds to equal numbers of storage elements in each state but the representation 122 of the tracking data 109 indicates unequal numbers of storage elements in each state, the read voltage engine 114 may identify one or more states having storage elements that have shifted from an originally programmed state to another state. To illustrate, storage elements that have shifted to another state may have threshold voltages that have been disturbed from a programmed value that is greater than a particular read voltage to a read value that is less than the particular read voltage. The read voltage engine 114 may adjust one or more read voltages to shift the boundaries between states to at least partially compensate for the shifted threshold voltages. As a result, adjusted read voltages may enable the controller 112 to read the tracking data 109 from the group of storage elements 106 with fewer errors as compared to using unadjusted read voltages. For example, updated read voltages 124 may be sent by the controller 112 to the memory 104 and used by the memory 104 to perform a subsequent read of the group of storage elements 106 of the memory 104.

Because the first portion 108 and the second portion 110 are within the same group of storage elements 106, such as the same word line, processes that affect storage elements in the first portion 108, such as read disturb, program disturb, data retention, etc., are likely to have similar effects on storage elements in the second portion 110. By adjusting the read voltages to achieve a reduction in errors when the tracking data 109 is read from the first portion 108, a similar reduction in errors may be achieved when the user data 111 is read from the second portion 110. As a result, the user data 111 may be read using the adjusted read voltages with greater accuracy and reduced errors based on comparing the representation 122 of the tracking data 109 read from the memory 104 to the originally programmed tracking data 109 without performing error correction coding (ECC) on the representation 122 of the tracking data 109.

By adjusting read voltages based on comparing a count of bits in the representation 122 of the tracking data 109 read from the memory 104 to a number of bits in the tracking data 109, a reduction in errors may be achieved. As a result, a reliability of stored data may be improved due to fewer bit errors occurring during storage in the memory 104. Improved reliability may enable operation using a less-powerful ECC engine, resulting in reduced power consumption, reduced device size, reduced manufacturing cost, or a combination thereof. Alternatively, or in addition, improved reliability may enable longer operational life of the memory 104. In addition, fewer errors may result in reduced ECC processing, enabling faster data retrieval and reduced latency detected by the host device 116.

FIG. 2 illustrates an example of updating a read voltage based on comparing a count of storage elements in one or more states in a representation of tracking data read from a memory to a count of storage elements in one or more corresponding states in tracking data, such as may be performed by the read voltage engine 114 of FIG. 1. For example, a first set of curves 210 represents cell voltage distributions (CVDs) of states of a multi-level-cell storage element (e.g., a 2-bit per cell storage element, a 3-bit per cell storage element, etc.), such as one or more storage elements of the group of storage elements 106 of FIG. 1, after threshold voltage shifting has occurred. A first curve 212 of the first set 210 represents a CVD of an erase state, a second curve 214 of the first set 210 represents a CVD of state A, a third curve 216 of the first set 210 represents a CVD of state B, and a fourth curve 218 of the first set 210 represents a CVD of state C. A first read voltage Va 213, a second read voltage Vb 215, and a third read voltage Vc 217 are also illustrated.

The first curve 212 represents a CVD of an erase state including a portion that crosses over the first read voltage Va 213. To illustrate, the first curve 212 has a portion that lies to the right of (i.e., having a greater voltage than) the read voltage Va 213 and another portion that lies to the left of the read voltage Va 213. Reading the storage elements with the read voltage Va 213 causes the storage elements of the portion of the first curve 212 to the right of the read voltage Va 213 to be misidentified as being in state A instead of in the erase state. Similarly, the second curve 214 has a portion that lies to the right of the read voltage Vb 215 and another portion that lies to the left of the read voltage Vb 215. Reading the storage elements with the read voltage Va 213 causes the storage elements of the portion of the second curve 214 to the right of the read voltage Vb 215 to be misidentified as being in state B instead of in state A. Similarly, the third curve 216 has a portion that lies to the left of the read voltage Vb 215, a portion between the read voltage Vb 215 and the read voltage Vc 217, and a portion to the right of the read voltage Vc 217. Reading the storage elements with the read voltage Vc 217 causes the storage elements of the portion of the third curve 216 to the right of the read voltage Vc 217 to be misidentified as being in state C instead of in state B, and reading the storage elements with the read voltage Vb 215 causes the storage elements of the portion of the third curve 216 to the left of the read voltage Vb 215 to be misidentified as being in state A instead of in state B. Similarly, the fourth curve 218 has a portion that lies to the left of the read voltage Vc 217. Reading the storage elements with the read voltage Vc 217 causes the storage elements of the portion of the fourth curve 218 to the left of the read voltage Vc 217 to be misidentified as being in state B instead of in state C.

A second set of curves 220 represents CVDs of the states of the multi-level-cell storage element after read voltage updating has occurred. A first curve 222 of the second set 220 represents a CVD of an erase state, a second curve 224 of the second set 220 represents a CVD of state A, a third curve 226 of the second set 220 represents a CVD of state B, and a fourth curve 228 of the second set 220 represents a CVD of state C. A first adjusted read voltage Va 223, a second adjusted read voltage Vb 225, and a third adjusted read voltage Vc 227 are also illustrated.

The tracking data 109 of FIG. 1 may be a portion of a tracking pattern with known locations in the memory 104 of FIG. 1. The tracking pattern includes a sequence of bits that correspond to one or more states of a flash memory cell. For example, in a 2-bit per cell multi-level-cell memory, the sequence of bits may include a first sequence of bits that corresponds to a first state of a flash memory cell, a second sequence of bits that corresponds to a second state of the flash memory cell, a third sequence of bits that corresponds to a third state of the flash memory cell, and a fourth sequence of bits that corresponds to a fourth state of the flash memory cell. To illustrate, the first sequence of bits may correspond to a logic level of "11" that corresponds to the erase state, the second sequence of bits may correspond to a logic level of "01" that corresponds to state A, the third sequence of bits may correspond to a logic level of "10" that corresponds to state B, and the fourth sequence of bits may correspond to a logic level of "00" that corresponds to state C. The tracking data 109 of FIG. 1 may also include a known number of bits per pattern. For example, the tracking data 109 may include an equal number of each of the bit sequences (e.g., an equal number of each of the states) such as 64 bit sequences corresponding to an erase state, 64 bit sequences corresponding to state A, 64 bit sequences corresponding to state B, and 64 bit sequences corresponding to state C. Alternatively or in addition, the tracking data 109 may include an unequal number of the bit sequences.

As an illustrative example, a 2-bit per cell storage element with a tracking pattern corresponding to equal numbers of storage elements per state (e.g., an original bit sequence 230 corresponding to 64 storage elements per state) is shown in FIG. 2. Over time, the stored tracking data 109 may be susceptible to errors and the representation 122 of the tracking data 109 read from the memory 104 of FIG. 1 may indicate unequal numbers of storage elements in each state. For example, one or more states may have storage elements that have shifted from an originally programmed state to another state.

Because the tracking data 109 of FIG. 1 is in a known location in the memory 104 of FIG. 1 and corresponds to a known number of storage elements per state, the controller 112 of FIG. 1 may determine a number of storage elements in a particular state when the tracking data 109 is programmed to the memory 104. For example, an original read bit sequence 232 prior to voltage shifting may be determined as having 64 storage elements for the erase state, 64 storage elements for state A, 64 storage elements for state B, and 64 storage elements for state C. The controller 112 of FIG. 1 may further determine a count of storage elements in a particular state in the representation 122 of the tracking data 109 of FIG. 1 and compare the number of storage elements in the particular state corresponding to the tracking data 109 to the count of storage elements in the particular state in the representation 122 of the tracking data 109.

For example, a bit sequence after voltage threshold shift 234 may be determined as having 59 storage elements for the erase state, 69 storage elements for state A, 68 storage elements for state B, and 60 storage elements for state C. The controller 112 of FIG. 1 may compare the count of storage elements in the erase state in the tracking pattern (e.g., 64) to the count of storage elements in the erase state in the representation 122 of the tracking data 109 read from the memory 104 of FIG. 1 (e.g., 59), and based on the comparison, the read voltage engine 114 of FIG. 1 may adjust a read voltage to be used by the controller 112 to read data from the memory 104. For example, the read voltage engine 114 may adjust one or more of the read voltages Va 213, Vb 215, and Vc 217 to shift the boundaries between states to at least partially compensate for the shifted threshold voltages, resulting in a partially corrected bit sequence 236 that more closely matches the original bit sequence 232. As a result, the adjusted read voltages Va 223, Vb 225, and Vc 227 may enable the controller 112 of FIG. 1 to read the tracking data 109 of FIG. 1 from the group of storage elements 106 of FIG. 1 with fewer errors as compared to using the unadjusted read voltages Va 213, Vb 215, and Vc 217.

A reduction in errors may be achieved by adjusting read voltages based on comparing a count of storage elements in one or more states in the representation 122 of the tracking data 109 read from the memory 104 to a count of storage elements in one or more corresponding states in the tracking data 109. As a result, a reliability of stored data may be improved due to fewer bit errors occurring during storage in the memory 104.

Figure 3:
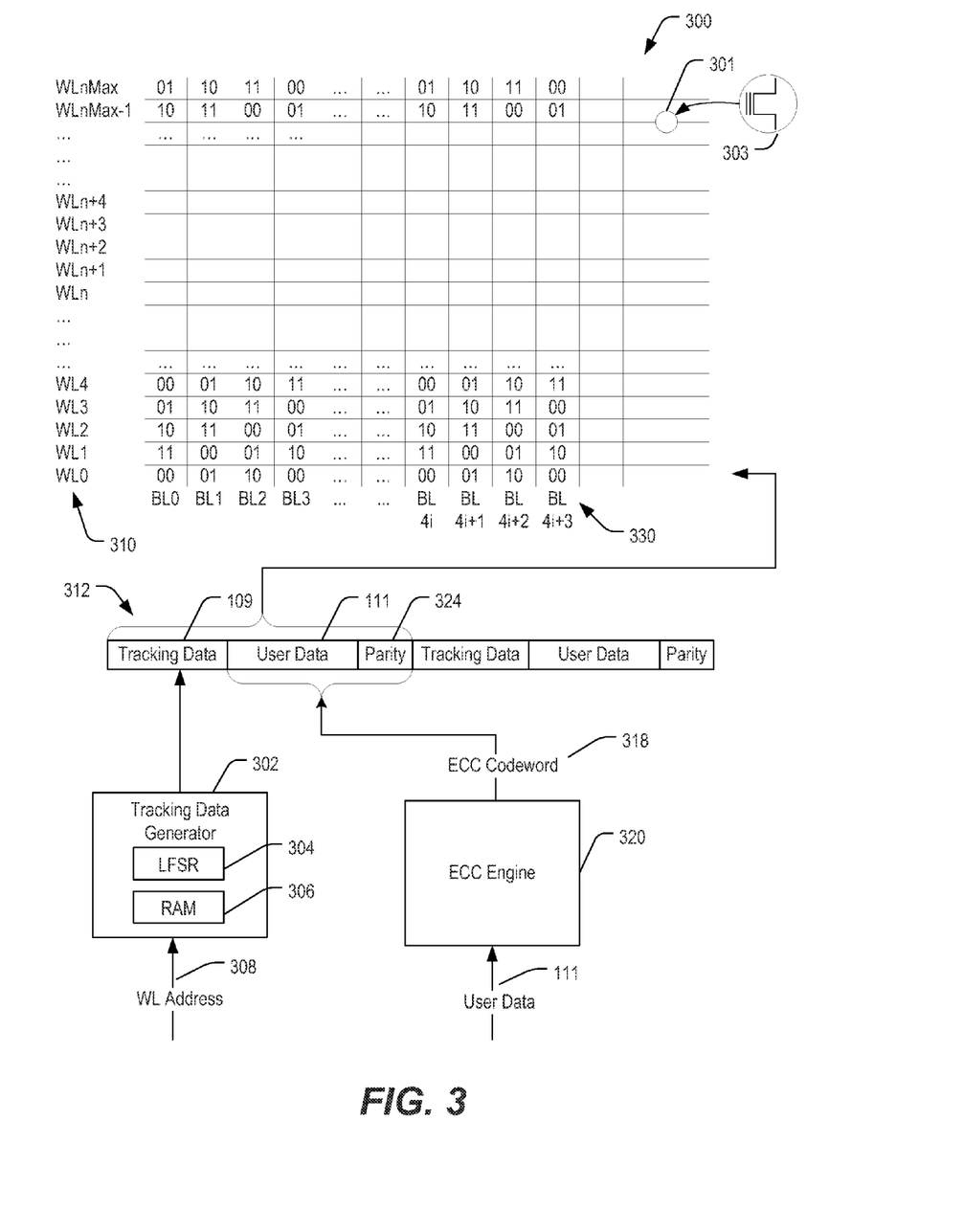
FIG. 3 is a diagram illustrating generation and storage of tracking data that includes a tracking pattern to be retrievable for determination of errors in the tracking data.

FIG. 3 illustrates a particular embodiment of generation and storage of tracking data to be retrievable from a memory, such as the memory 104 of FIG. 1, for determination of errors in the tracking data. A memory cell array 300 includes a plurality of word lines 310 and a plurality of bit lines 330. A cross point between a particular word line and a particular bit line represents a memory cell, such as a representative memory cell 301. The representative memory cell 301 may be a NAND flash memory cell and may include a floating gate transistor 303.

A tracking data generator 302 may be configured to generate tracking data, such as the tracking data 109, to be stored in the memory cell array 300. The tracking data may include a portion of a tracking pattern such as the tracking pattern described with respect to FIG. 2. The tracking data generator 302 may include a linear feedback shift register (LFSR) 304 and a random access memory (RAM) 306. For example, the tracking data generator 302 may load a bit sequence from the RAM 306 to initiate the LFSR 304 to generate a tracking pattern. Alternatively, or in addition, the tracking pattern may be stored in the RAM 306 in place of using the LFSR 304.

The tracking data generator 302 may receive a word line address 308 associated with a write request from a host device, such as the host device 116 of FIG. 1, and may be configured to generate the tracking data 109 based on the word line address 308 and to store the tracking data 109 in a portion of a word line 312. The tracking data 109 may be stored in a first portion of the word line 312 in a group of memory cells at consecutive indices of the word line 312. Alternatively, or in addition, the tracking data 109 may be stored in multiple portions within the word line 312, such as in a first and third portion of the word line 312 that may be separated by user data stored in a second portion of the word line 312. The tracking data generator 302 may generate a tracking pattern that includes a repeating series of bit sequences "00", "01", "10", and "11". A starting sequence of the repeating series of sequences may be selected based on the word line address 308 so that neighboring adjacent cells in word lines store different bit sequences. In an implementation where user data is interleaved across multiple logical pages of the word line 312, the tracking data 109 may correspond to the tracking pattern. In an implementation where user data is not interleaved across multiple pages of the word line 312, the tracking data 109 may correspond to a single bit of each bit sequence of the tracking pattern.

An ECC engine 320 may be configured to receive user data, such as the user data 111, from a host device, such as the host device 116 of FIG. 1, and to generate a codeword 322 that includes the user data 111 and parity bits 324. The ECC engine 320 may be configured to store the codeword 322 in a second portion of the word line 312 such that the tracking data 109 in the first portion of the word line 312 is separated from the tracking data 109 in the third portion of the word line 312 by the user data 111 in the codeword 322. In a particular implementation, the tracking data 109 and the codeword 322 may be written to the word line 312 substantially concurrently. For example, the ECC engine 320 may include a Reed Solomon encoder, a Bose-Chaudhuri-Hocquenghem (BCH encoder), a low density parity check (LDPC) encoder, a turbo code encoder, an encoder configured to encode one or more other ECC encoding schemes, or any combination thereof. The ECC engine 320 may also include a decoder configured to decode data read from the memory cell array 300 to detect and correct, up to an error correction capability of a particular ECC scheme, bit errors that may be present in the user data 111.

During operation, the tracking data generator 302 may generate the tracking data 109 to be stored in a first portion of the word line 312 within the memory cell array 300 and the ECC engine 320 may generate the codeword 322 that includes the user data 111 and the parity bits 324 to be stored in a second portion of the word line 312. The tracking data 109 may be retrievable for determination of errors in the tracking data 109.

By storing the tracking data 109 with the user data 111 in the same word line of the memory cell array 300, processes that affect storage elements in the first portion of the word line 312, such as read disturb, program disturb, data retention, etc., are likely to have similar effects on storage elements in the second portion of the word line 312. By adjusting read voltages to achieve a reduction in errors in the tracking data 109 read from the first portion of the word line 312, a similar reduction in errors may be achieved in the user data 111 read from the second portion of the word line 312. As a result, the user data 111 (and the parity bits 324) may be read using the adjusted read voltages with greater accuracy and reduced errors.

Figure 4:
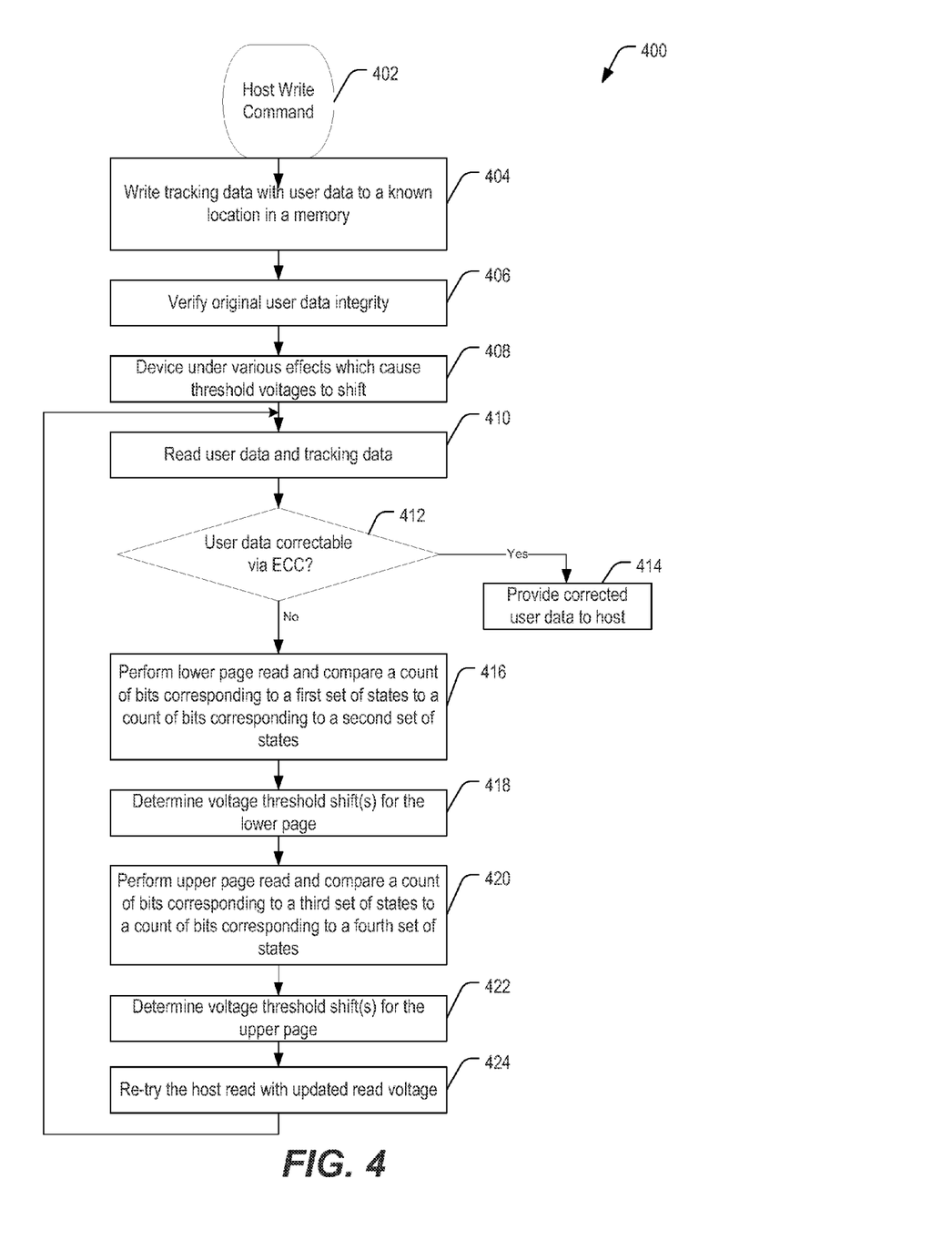
FIG. 4 is a flow diagram illustrating a particular embodiment of a method of comparing a count of bits in a representation of tracking data read from a memory to a corresponding count of bits in tracking data.

Referring to FIG. 4, a flowchart of an illustrative embodiment of a method 400 of updating threshold voltages based on comparing a count of storage elements in one or more states in a representation of tracking data read from a memory to a count of storage elements in one or more corresponding states in tracking data is illustrated. The method 400 may be applied by the data storage device 102 of FIG. 1.

A host write command may be received, at 402. For example, the data storage device 102 of FIG. 1 may receive a write command form the host device 116 of FIG. 1 to provide data to be stored in the memory 104 of FIG. 1.

Tracking data may be written with user data to a known location in a memory, at 404. For example, the tracking data generator 302 of FIG. 3 may generate the tracking data 109 of FIG. 1 to be written to a first portion of the word line 312 of FIG. 3 within the memory cell array 300 of FIG. 3 and the ECC engine 320 of FIG. 3 may generate the codeword 322 of FIG. 3 that includes the user data 111 of FIG. 1 to be written to a second portion of the word line 312.

The integrity of the original user data may be verified, at 406. For example, the controller 112 of FIG. 1 may read the originally stored user data 111 of FIG. 1 from the memory 104 of FIG. 1 and may verify the integrity of the user data 111 via the ECC engine 320 of FIG. 3.

Over time, the stored tracking data 109 of FIG. 1 and the stored user data 111 of FIG. 1 may be susceptible to errors such as data retention, read disturb, and/or program disturb. As such, threshold voltages of data storage elements within the memory 104 of FIG. 1 may shift, producing errors when read using an original set of read voltages, as shown at 408.

User data and tracking data may be read, at 410 (e.g., in response to a host request for the user data), and a determination may be made whether the user data is correctable via error correction coding, at 412. For example, the controller 112 of FIG. 1 may read the representation 126 of the user data 111 of FIG. 1 and the representation 122 of the tracking data 109 of FIG. 1 from the memory 104 of FIG. 1. The controller 112 of FIG. 1 may determine whether the representation 126 of the user data 111 of FIG. 1 is correctable via error correction coding (ECC) decoding. If the representation 126 of the user data 111 is correctable via ECC decoding, then corrected user data may be provided to the host, such as the host device 116 of FIG. 1, at 414.

If the representation 126 of the user data 111 is not correctable via ECC decoding, then a read operation may be performed on a lower page of the storage elements, at 416. A comparison of counts of bits in the lower page in a first set of states may be made to counts of bits in the lower page in a second set of states. For example, in a 2-bit per cell multilevel-cell memory, a first set of states may correspond to states that have a value of "1" in the lower page and a second set of states may correspond to states having a value of "0" in the lower page. A first count of bits with the value of "1" in the lower page may be compared to a second count of bits with the value of "0" in the lower page. To illustrate, the first set of states may correspond to the erase state (e.g., logic value "11") and the state A (e.g., logic value "01") of FIG. 2, and the second set of states may correspond to the state B (e.g., logic value "10") and the state C (e.g., logic value "00") of FIG. 2. The controller 112 of FIG. 1 may compare the first count of bits with the value of "1" in the erase state and in the state A to the second count of bits with the value of "0" in the state B and the state C, such as when the tracking data 109 corresponds to equal numbers of storage elements in each state. Alternatively, the controller 112 of FIG. 1 may compare the first count of bits with the value of "1" in the erase state and in the state A to a number of bits having a "1" value in the tracking data 109 (e.g., the bits of the tracking pattern of FIG. 3 stored in the lower page of the word line 312).

Voltage threshold shift(s) may be determined for the lower page, at 418. To illustrate, in an implementation where the tracking pattern corresponds to equal numbers of storage elements in each state, the read voltage Vb 215 of FIG. 2 may be shifted to substantially equalize the first count of bits with the value of "1" in the lower page with the second count of bits with the value of "0" in the lower page. For example, if the first count of bits in the lower page in the erase state and the state A equals the second count of bits in the lower page in the state B and the state C, then the read voltage Vb 215 is not shifted. If the first count of bits in the lower page in the erase state and the state A is less than the second count of bits in the lower page in the state B and the state C, then the read voltage Vb 215 is shifted to the right (e.g., increased). If the first count of bits in the lower page in the erase state and the state A is greater than the second count of bits in the lower page in the state B and the state C, then the read voltage Vb 215 is shifted to the left (e.g., decreased). The read voltage engine 114 of FIG. 1 may adjust one or more of the read voltages Va 213, Vb 215, or Vc 217 to be used by the controller 112 of FIG. 1 to read data from the memory 104 of FIG. 1.

A read operation may be performed on an upper page of the storage elements, at 420. A comparison of counts of bits in the upper page in a third set of states may be made to counts of bits in the upper page in a fourth set of states. For example, in the 2-bit per cell multi-level-cell memory, a third set of states may correspond to states that have a value of "1" in the upper page and a fourth set of states may correspond to states having a value of "0" in the upper page. A third count of bits with the value of "1" in the upper page may be compared to a fourth count of bits with a value of "0" in the upper page, and a fifth count of bits with the value of "0" in the upper page may be compared to a sixth count of bits with a value of "0" in the upper page. To illustrate, the third set of states may correspond to the erase state (e.g., logic value "11") and the state B (e.g., logic value "10") of FIG. 2, and the fourth set of states may correspond to the state A (e.g., logic value "01") and the state C (e.g., logic value "00") of FIG. 2. The third count of bits with the value of "1" in the upper page (corresponding to the erase state) may be compared to the fourth count of bits with the value of "0" in the upper page (corresponding to the state A). Similarly, the fifth count of bits with the value of "1" in the upper page (corresponding to the state B) may be compared to the sixth count of bits with the value of "0" in the upper page (corresponding to the state C).

Voltage threshold shift(s) may be determined for the upper page, at 422. For example, the read voltage Va 213 of FIG. 2 may be shifted to substantially equalize the third count of bits with the value of "1" in the upper page (corresponding to the erase state) with the fourth count of bits with the value of "0" in the upper page (corresponding to the state A). If the third count of bits in the upper page with a value of "1" in the erase state equals the fourth count of bits in the upper page with a value of "0" in the state A, then the read voltage Va 213 is not shifted. If the third count of bits in the upper page with a value of "1" in the erase state is less than the fourth count of bits in the upper page with a value of "0" in the state A, then the read voltage Va 213 is shifted to the right (e.g., increased). If the third count of bits in the upper page with a value of "1" in the erase state is greater than the fourth count of bits in the upper page with a value of "0" in the state A, then the read voltage Va 213 is shifted to the left (e.g., decreased).

Similarly, the read voltage Vc 217 of FIG. 2 may be shifted to substantially equalize the fifth count of bits with the value of "1" in the upper page (corresponding to the state B) with the sixth count of bits with the value of "0" in the upper page (corresponding to the state C). If the fifth count of bits in the upper page with a value of "1" in the state B equals the sixth count of bits in the upper page with a value of "0" in the state C, then the read voltage Vc 217 is not shifted. If the fifth count of bits in the upper page with a value of "1" in the state B is less than the sixth count of bits in the upper page with a value of "0" in the state C, then the read voltage Vc 217 is shifted to the right (e.g., increased). If the fifth count of bits in the upper page with a value of "1" in the state B is greater than the sixth count of bits in the upper page with a value of "0" in the state C, then the read voltage Vc 217 is shifted to the left (e.g., decreased).

A subsequent read with updated read voltage(s) may be performed, at 424. For example, the updated read voltages 124 of FIG. 1 may be sent by the controller 112 of FIG. 1 to the memory 104 of FIG. 1 and used by the memory 104 of FIG. 1 to perform a subsequent read of the group of storage elements 106 of FIG. 1 of the memory 104 of FIG. 1.

Although the method 400 includes comparing counts of bits in data read from the memory, in other embodiments counts of bits in data read from the memory may be compared to corresponding numbers of bits of the tracking data. For example, in the example provided in FIG. 2 wherein 128 storage elements are in the erase state or state A, the tracking data for the lower page would be read as having 128 "1" bits and 128 "0" bits if no storage elements have shifted states from originally programmed states. A count of "1" bits in the representation of the tracking data read from the lower page may be compared to the number 128 rather than compared to the count of "0" bits from the lower page tracking data. As another example, because 64 storage elements are in the erase state in the example of FIG. 2, a count of "1" bits corresponding to the upper page of storage elements in the erase state may be compared to the number 64.

A reduction in errors may be achieved by adjusting read voltages based on comparing a count of storage elements in one or more states in the representation 122 of the tracking data 109 of FIG. 1 read from the memory 104 of FIG. 1 to a number of storage elements corresponding to one or more corresponding states in the tracking data 109 of FIG. 1. As a result, a reliability of stored data may be improved due to fewer bit errors occurring during storage in the memory 104 of FIG. 1.

Figure 5:
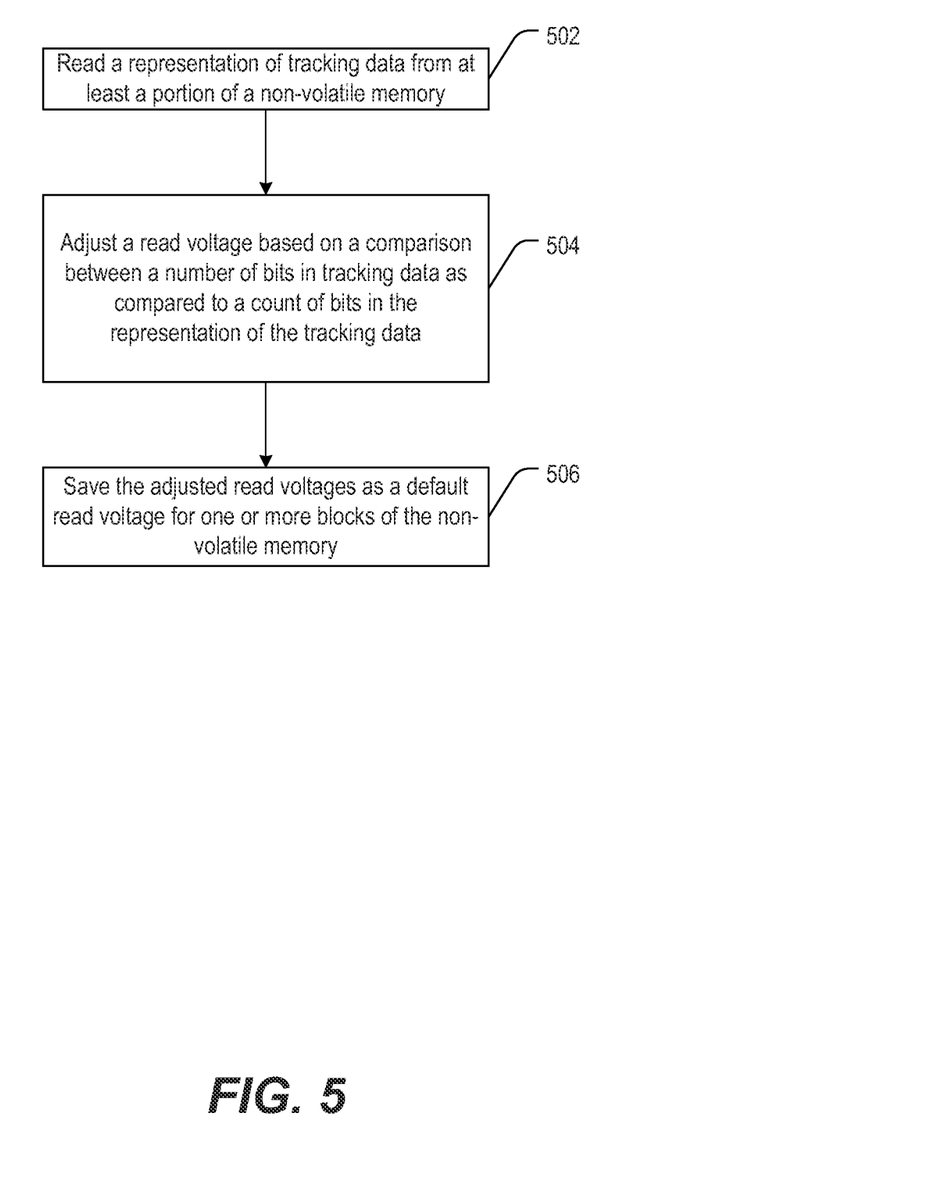
FIG. 5 is a flow diagram illustrating another particular embodiment of a method of comparing a count bits in a representation of tracking data read from a memory to a corresponding count of bits in tracking data.

Referring to FIG. 5, a flowchart of an illustrative embodiment of a method 500 of updating read voltages based on comparing a count of bits in a representation of tracking data read from a memory to a number of bits in tracking data is illustrated. The method 500 may be applied by the data storage device 102 of FIG. 1.

A representation of tracking data may be read from at least a portion of a non-volatile memory, at 502. For example, the representation 122 of the tracking data 109 of FIG. 1 may be read from the first portion 108 of FIG. 1 of the memory 104 of FIG. 1.

A read voltage may be adjusted based on a comparison between a number of bits in tracking data as compared to a count of bits in the representation of the tracking data, at 504. For example, the read voltage engine 114 of FIG. 1 may be configured to adjust a read voltage to be used by the controller 112 of FIG. 1 to read data from the memory 104 of FIG. 1 based on the comparison. To illustrate, the controller 112 of FIG. 1 may compare the count of bits that correspond to storage elements in state A in the representation of the tracking data (e.g., 69 as illustrated in FIG. 2) to the count of bits that correspond to storage elements in state A in the originally stored tracking data (e.g., 64 as illustrated in FIG. 2). Based on the comparison, the read voltage engine 114 of FIG. 1 may identify that storage elements have shifted from another state (e.g., the erase state and/or the state B) to the originally programmed state A. The read voltage engine 114 of FIG. 1 may adjust one or more read voltages to shift the boundaries between states to compensate for the shifted threshold voltages.

The adjusted read voltage may be saved as a default read voltage for one or more blocks of the non-volatile memory, at 506. For example, the updated read voltage 124 of FIG. 1 may be sent by the controller 112 to the memory 104 and used by the memory 104 to perform a subsequent read of one or more blocks of the memory 104.

The method 500 therefore enables correction of read voltages to accommodate shifting threshold voltages to reduce errors without using error correction coding (ECC) decoding.

Figure 6:
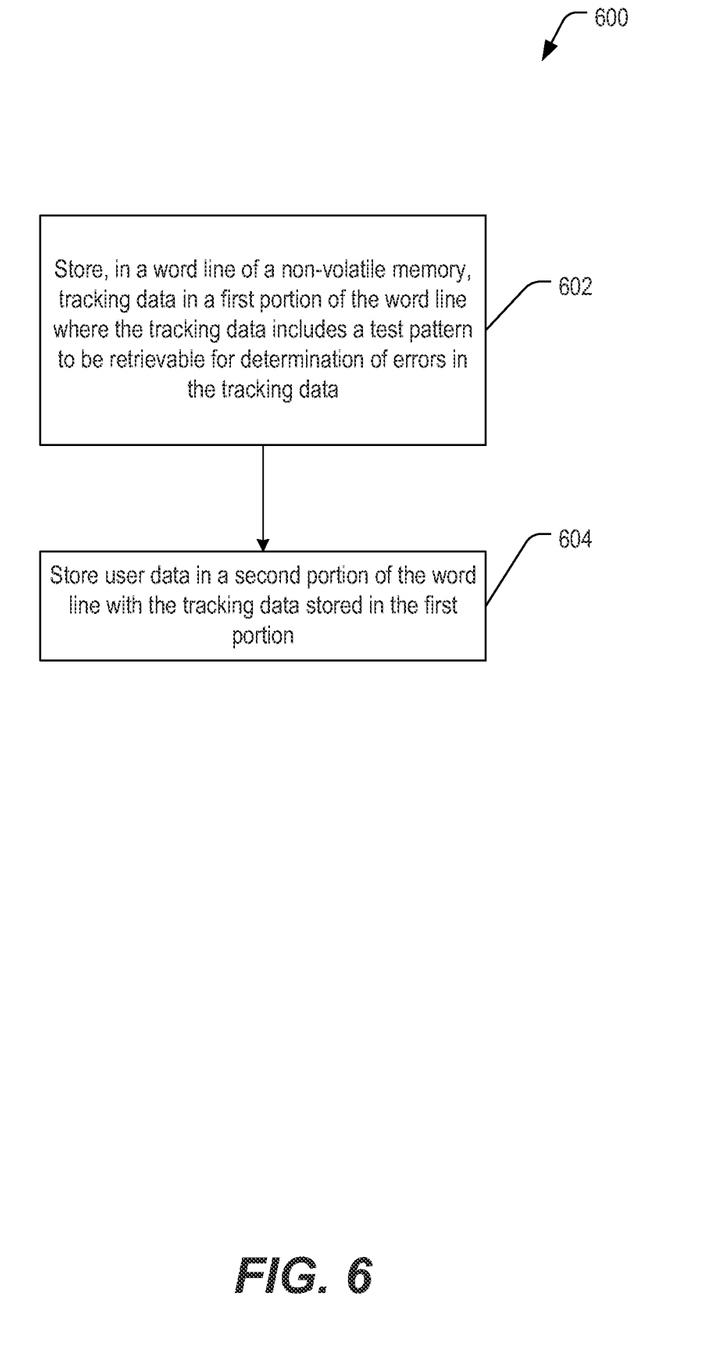
FIG. 6 is a flow diagram illustrating a particular embodiment of a method of storing tracking data with user data to be retrievable for updating of read voltages.

Referring to FIG. 6, a flowchart of an illustrative embodiment of a method 600 of storing tracking data with user data to be retrievable for updating of read voltages. The method 600 may be applied by the data storage device 102 of FIG. 1.

The method 600 may include storing, in a word line of a non-volatile memory, tracking data in a first portion of the word line with user data in a second portion of the word line, where the tracking data may include a tracking pattern to be retrievable for determination of errors in the tracking data. To illustrate, tracking data may be stored in a first portion of a word line of a non-volatile memory, where the tracking data may include a tracking pattern that is retrievable for determination of errors in the tracking data, at 602. For example, the tracking data generator 302 of FIG. 3 may generate the tracking data 109 of FIG. 1 to be written to a first portion of the word line 312 of FIG. 3 within the memory cell array 300 of FIG. 3.

User data may be stored in a second portion of the word line, at 604. For example, the ECC engine 320 of FIG. 3 may generate the codeword 322 of FIG. 3 that includes the user data 111 of FIG. 1 to be written to a second portion of the word line 312.

The tracking data is retrievable for determination of errors in the tracking data. To illustrate, when data is to be read from the memory 104 of FIG. 1, the controller 112 of FIG. 1 may read the representation 122 of the tracking data 109 from the first portion 108 of FIG. 1 and may compare a count of storage elements in one or more states in the representation 122 of the tracking data 109 read from the memory 104 of FIG. 1 to a count of storage elements in one or more corresponding states in the tracking data 109 of FIG. 1. The read voltage engine 114 of FIG. 1 may adjust a read voltage to be used by the controller 112 of FIG. 1 to read data from the memory 104 of FIG. 1 based on the comparison.

By adjusting read voltages based on comparing a count of storage elements in one or more states in the representation 122 of the tracking data 109 of FIG. 1 read from the memory 104 of FIG. 1 to a count of storage elements in one or more corresponding states in the tracking data 109 of FIG. 1, a reduction in errors may be achieved. As a result, a reliability of stored data may be improved due to fewer bit errors occurring during storage in the memory 104 of FIG. 1.

Although various components depicted herein are illustrated as block components and described in general terms, such components may include one or more microprocessors, state machines, or other circuits configured to enable a data storage device, such as the data storage device 102 of FIG. 1, to perform the particular functions attributed to such components. For example, the read voltage engine 114 of FIG. 1 may represent physical components, such as controllers, processors, state machines, logic circuits, or other structures to create an updated set of read voltages.

In a particular embodiment, the data storage device 102 may be a portable device configured to be selectively coupled to one or more external devices. For example, the data storage device 102 may be a removable device such as a universal serial bus (USB) flash drive or a removable memory card. However, in other embodiments, the data storage device 102 may be attached or embedded within one or more host devices, such as within a housing of a portable communication device. For example, the data storage device 102 may be within a packaged apparatus, such as a wireless telephone, a personal digital assistant (PDA), a gaming device or console, a portable navigation device, a computer, or other device that uses internal non-volatile memory. In a particular embodiment, the data storage device 104 includes a non-volatile memory, such as a Flash memory (e.g., NAND, NOR, Multi-Level Cell (MLC), Divided bit-line NOR (DINOR), AND, high capacitive coupling ratio (HiCR), asymmetrical contactless transistor (ACT), or other Flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
   reading data from a non-volatile memory in response to a host read request; and
   in response to the read data being uncorrectable via error correction code (ECC) decoding:
   reading a representation of tracking data from at least a portion of the non-volatile memory; and
   adjusting a read voltage based on a comparison between a number of bits having a particular bit value in the tracking data to a count of bits having the particular bit value in the representation of the tracking data.

2. The method of claim 1, wherein the number of bits having the particular bit value in the tracking data corresponds to a first number of storage elements in one or more states when the tracking data is stored to a group of storage elements in the non-volatile memory, and wherein the count of bits having the particular bit value in the representation of the tracking data corresponds to a second number of storage elements in the one or more states when the representation of the tracking data is read from the group of storage elements.

3. The method of claim 1, wherein the tracking data is a portion of a tracking pattern that is stored in the portion of the non-volatile memory.

4. The method of claim 3, wherein the tracking pattern is interleaved over multiple logical pages in the non-volatile memory, and wherein the tracking data is the portion of the tracking pattern at a single logical page of the multiple logical pages.

5. The method of claim 1, wherein the portion of the non-volatile memory comprises a group of cells at consecutive indices of a wordline.

6. The method of claim 1, wherein the portion of the non-volatile memory comprises multiple portions and wherein the multiple portions are separated by user data storage elements.

7. The method of claim 1, wherein the tracking data is generated by a tracking data generator.

8. The method of claim 7, wherein the tracking data generator includes a linear feedback shift register.

9. The method of claim 1, further comprising saving the adjusted read voltage as a default read voltage for one or more blocks of the non-volatile memory.

10. The method of claim 1, wherein the read voltage is adjusted without error correction code (ECC) decoding of the representation of the tracking data.

11. A method comprising:
   storing, in a group of storage elements at a wordline of a non-volatile memory, tracking data in a first portion of the group of storage elements and storing user data in a second portion of the group of storage elements, wherein the tracking data is retrievable for determination of errors in the tracking data;
   reading a representation of the user data from the second portion responsive to a host read request; and
   in response to the representation of the user data being uncorrectable via error correction code (ECC) decoding, adjusting a read voltage based on a comparison between a number of bits having a particular bit value in the tracking data to a count of bits having the particular bit value in a representation of the tracking data read from the first portion.

12. The method of claim 11, wherein the representation of the tracking data is read from the non-volatile memory in response to a determination that the representation of the user data is uncorrectable.

13. The method of claim 11, wherein the tracking data is generated by a tracking data generator.

14. The method of claim 13, wherein the tracking data generator includes a linear feedback shift register.

15. The method of claim 11, wherein the first portion comprises storage elements at consecutive indices of the wordline.

16. The method of claim 11, wherein the first portion comprises multiple groups of storage elements and wherein storage elements of the second portion are located along the wordline between the multiple groups.

17. A data storage device comprising:
   a non-volatile memory coupled to a controller, wherein the controller is configured to read a representation of user data from the non-volatile memory in response to a host read request and to initiate error correction code (ECC) decoding of the representation of the user data; and
   a read voltage correction engine configured to adjust a read voltage to be used by the controller to read data from the non-volatile memory, wherein the read voltage is adjusted responsive to the representation of the user data being uncorrectable by the ECC decoding, and wherein the read voltage is adjusted based on a comparison between a count of storage elements that are determined to be in one or more states based on a representation of tracking data read from the non-volatile memory as compared to a number of storage elements in the one or more states according to a tracking pattern that includes the tracking data.

18. The data storage device of claim 17, wherein the read voltage correction engine is in the controller.

19. The data storage device of claim 17, wherein the read voltage correction engine is in the non-volatile memory.

20. The data storage device of claim 17, wherein the controller is configured to read the representation of tracking data from a portion of the non-volatile memory, wherein the portion of the non-volatile memory comprises a group of cells at consecutive indices of a wordline.

21. The data storage device of claim 17, wherein the controller is configured to read the representation of tracking data from a portion of the non-volatile memory, wherein the portion of the non-volatile memory comprises multiple portions, and wherein the multiple portions are separated by user data storage elements.

22. The data storage device of claim 17, further comprising a tracking data generator, and wherein the tracking data is generated by the tracking data generator.

23. The data storage device of claim 22, wherein the tracking data generator includes a linear feedback shift register.

24. The data storage device of claim 17, wherein the controller is configured to save the adjusted read voltage as a default read voltage for one or more blocks of the non-volatile memory.

25. The data storage device of claim 17, wherein the read voltage correction engine is further configured to adjust the read voltage without error correction code (ECC) decoding of the representation of the tracking data.

* * * * *